United States Patent
Kwon et al.

(10) Patent No.: US 7,190,073 B2
(45) Date of Patent: Mar. 13, 2007

(54) CIRCUIT FILM WITH BUMP, FILM PACKAGE USING THE SAME, AND RELATED FABRICATION METHODS

(75) Inventors: Yong-Hwan Kwon, Gyeonggi-do (KR);
Sa-Yoon Kang, Seoul (KR);
Chung-Sun Lee, Gyeonggi-do (KR);
Kyoung-Sei Choi, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/158,164

(22) Filed: Jun. 20, 2005

(65) Prior Publication Data

US 2005/0285277 A1 Dec. 29, 2005

(30) Foreign Application Priority Data

Jun. 25, 2004 (KR) ............ 10-2004-0048184

(51) Int. Cl.
*H01L 23/48* (2006.01)
(52) U.S. Cl. .............. 257/737; 257/739; 257/773; 438/613
(58) Field of Classification Search ........ 257/737, 257/739
See application file for complete search history.

(56) References Cited

U.S. PATENT DOCUMENTS 5,814,393 A * 9/1998 Miyaake et al. ........... 428/209
6,556,030 B1 * 4/2003 Akram ..................... 324/754
6,903,463 B1 * 6/2005 Takeichi et al. ........... 257/778
6,940,162 B2 * 9/2005 Eguchi et al. ............. 257/723
2001/0053567 A1 * 12/2001 Akram et al. .............. 438/127

FOREIGN PATENT DOCUMENTS

| JP | 5-95027 | 4/1993 |
| JP | 08-292443 | 11/1996 |
| JP | 2003-243455 | 8/2003 |
| KR | 1996-0011526 | 4/1996 |
| KR | 2003-00333706 | 1/2003 |

OTHER PUBLICATIONS

English language abstract of Korean Publication No. 1996-0011526.
English language abstract of Japanese Publication No. 08-292443.
English language abstract of Japanese Publication No. 5-95027.
English language abstract of Japanese Publication No. 2003-243455.
English language abstract of Korean Publication No. 2003-0033706.

* cited by examiner

*Primary Examiner*—Leonardo Andujar
*Assistant Examiner*—Krista Soderholm
(74) *Attorney, Agent, or Firm*—Marger Johnson & McCollom, P.C.

(57) ABSTRACT

A circuit film having film bumps is provided for a film package. An IC chip is mechanically joined and electrically coupled to the circuit film through the film bumps instead of conventional chip bumps. In a fabrication method, a base film is partially etched by a laser to create an etched area that defines raised portion relatively raised from the etched area. Then a circuit pattern is selectively formed on the base film, partly running over the raised portions. The raised portion and the overlying circuit pattern constitute the film bumps having a height not greater than the height of the circuit film.

14 Claims, 11 Drawing Sheets

CIRCUIT FILM WITH BUMP, FILM PACKAGE USING THE SAME, AND RELATED FABRICATION METHODS

CROSS REFERENCE TO RELATED APPLICATIONS

This U.S. non-provisional application claims priority under 35 U.S.C. §119 from Korean Patent Application No. 2004-48184, which was filed in the Korean Intellectual Property Office on Jun. 25, 2004, the contents of which are incorporated by reference herein in its entirety.

BACKGROUND OF THE INVENTION

1. Field of the Invention

The present invention relates generally to electronic packaging technology and, more particularly, to a semiconductor package using a circuit film as a substrate.

2. Description of the Related Art

With the current trend of high integration in semiconductor devices, related assembly technology for packaging and interconnecting the semiconductor devices is becoming increasingly important. Consequently, there is a growing tendency to make semiconductor packages smaller, thinner, lighter, and more multifunctional. For example, the increased market demands for mobile handsets and liquid crystal displays (LCDs) have influenced semiconductor packaging. To meet these needs, several types of packages using a circuit film as a substrate have been developed and introduced in the art.

Figure 1A:
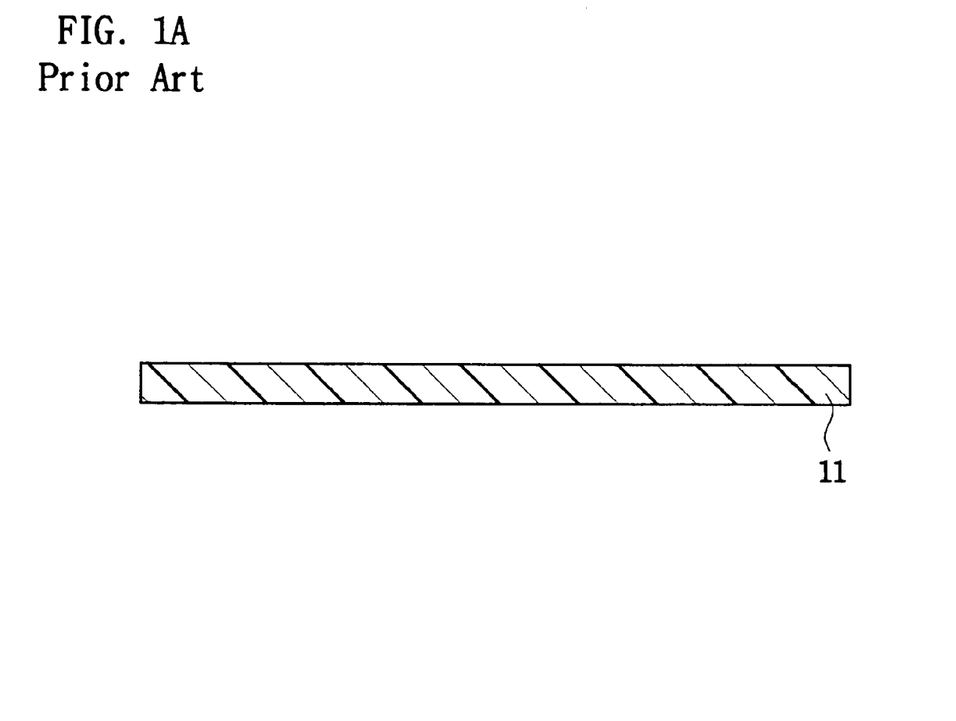
FIGS. 1A to 1C are cross-sectional views showing a conventional circuit film and a related manufacturing process.
Figure 1B:
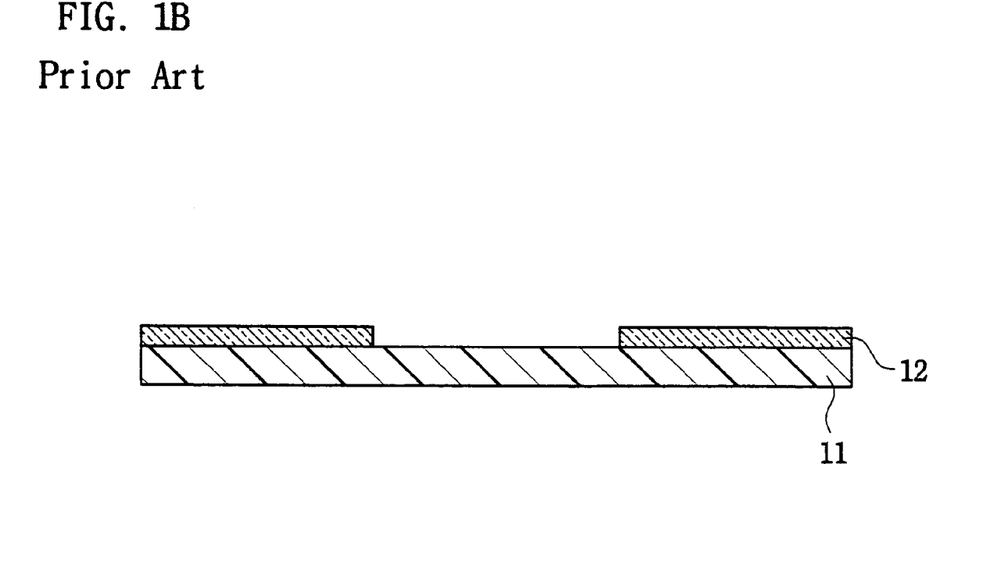
Figure 1C:
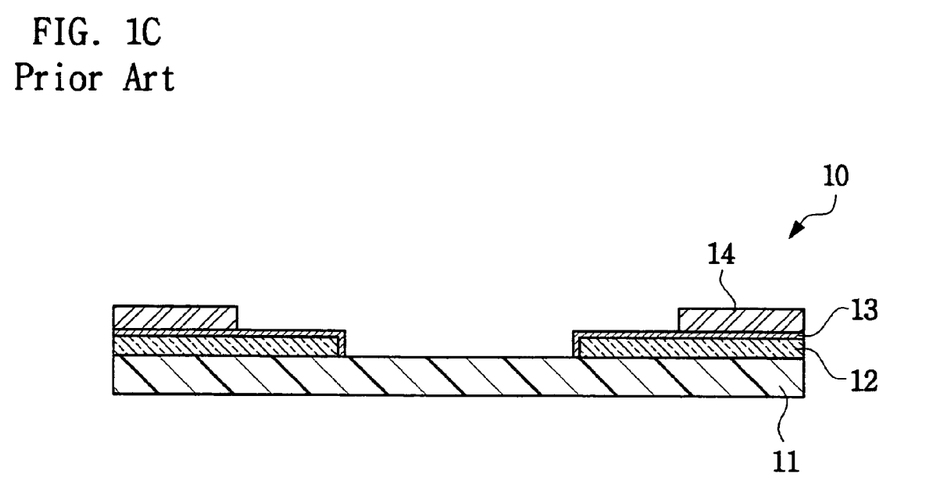

FIGS. 1A to 1C show cross-sectional views of a conventional circuit film 10 and a related fabrication process. Referring to FIGS. 1A to 1C, the circuit film 10 is based on a thin, flexible, insulating base film 11. A circuit pattern 12 is formed on the base film 11 and then coated with a metal coating layer 13. A resultant structure on the base film 11 is covered with a protective layer 14 except one end of each circuit pattern 12 coated with the metal layer 13. The non-covered end of the circuit pattern 12 is then connected with an integrated circuit (IC) chip.

Figure 2:
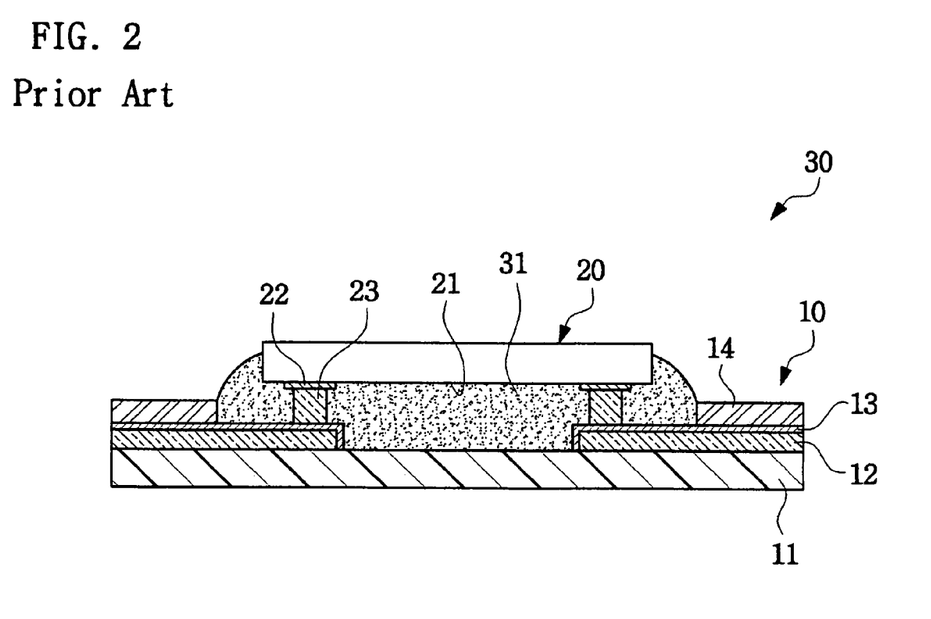
FIG. 2 is a cross-sectional view of a conventional film package.

FIG. 2 illustrates a cross-sectional view of a conventional film package 30 using the circuit film 10. This illustrates a chip-on-film (COF) package. As shown in FIG. 2, the circuit pattern 12 is connected with a chip bump 23 of the IC chip 20. The IC chip 20 has a number of input/output (I/O) pads 22 on an active surface 21, with a chip bump 23 formed on each I/O pad 22. In addition, a sealing resin 31 between the circuit film 10 and the IC chip 20 protects and supports the circuit pattern 12 and the chip bump 23.

As discussed, in a conventional film package 30 the chip bumps 23 physically join and electrically couple the circuit film 10 and the IC chip 20. Typically, the chip bumps 23 are made of gold, solder, or other various metals, and have a desired height.

Figure 3A:
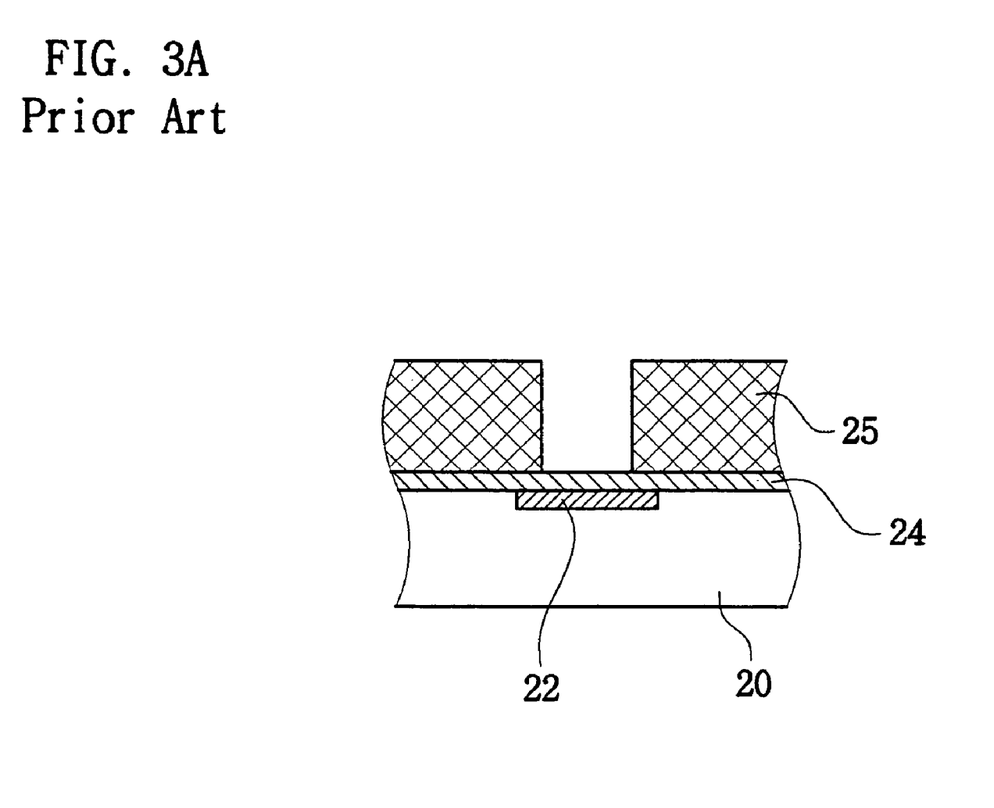
FIGS. 3A to 3C are cross-sectional views showing a conventional method of forming chip bumps.
Figure 3B:
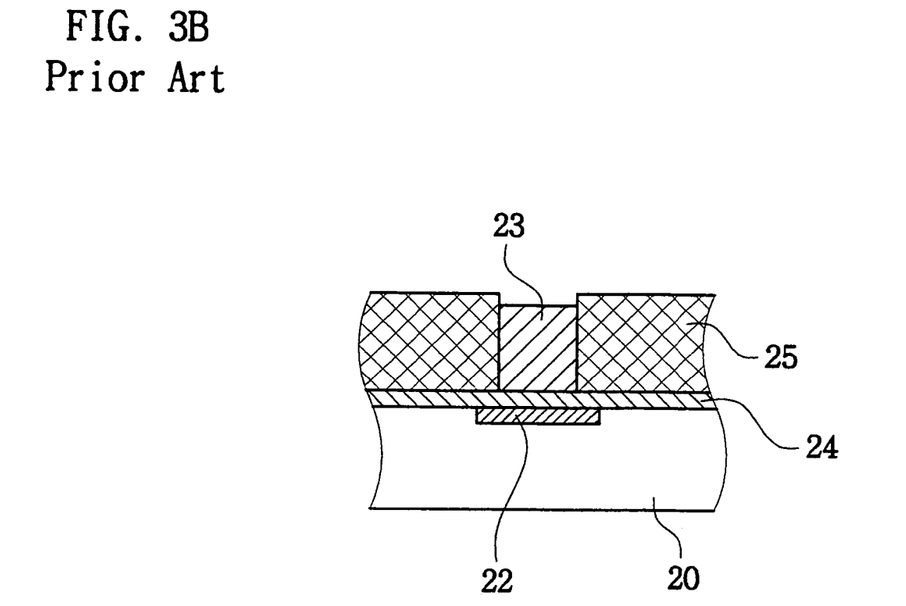
Figure 3C:
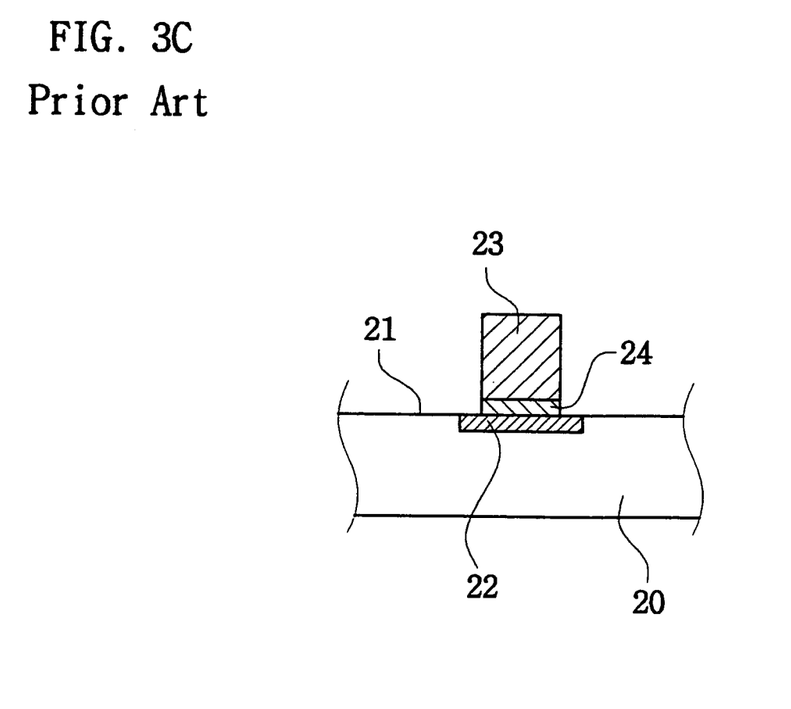

FIGS. 3A to 3C show, in cross-sectional views, a conventional method of forming the chip bumps 23. Referring to FIGS. 3A to 3C, first of all, an under bump metal (UBM) 24 is deposited on the active surface of the IC chip 20. Then, a photoresist material is coated on the UBM 24 and patterned to form a photoresist pattern 25 exposing the I/O pads 22. Next, a bump material is plated on the I/O pads 22 through the photoresist pattern 25 to form the chip bumps 23. Thereafter, the photoresist pattern 25 is removed, and the UBM 24 is selectively etched using the chip bumps 23 as an etching mask.

Since the conventional film package 30 uses the chip bumps 23 formed by the above-discussed method, related fabrication processes may be complicated and lengthy, and fabrication cost may be increased.

SUMMARY OF THE INVENTION

Exemplary embodiments of the present invention include a new and improved circuit film, a film package using the circuit film, and related fabrication methods.

According to an embodiment, a circuit film may comprise a base film, at least one raised portion in the base film, and a circuit pattern selectively formed on the base film and partly running over the raised portion. In the circuit film, the raised portion and the overlying circuit pattern may constitute film bumps.

In the circuit film, the base film may have an etched area defining the raised portion. A first thickness of the base film at the raised portion may be substantially equal to a second thickness of the base film outside the etched area. The first and second thickness of the base film may be about 35 μm to about 40 μm. A relative height of the raised portion from the etched area may be about 3 μm to about 20 μm. The circuit pattern may have a metal coating layer formed thereon. The circuit pattern may be formed of copper, and example metal coating layers may be formed of tin or nickel/gold.

According to an embodiment, a method of fabricating a circuit film may comprise partially etching a base film to create an etched area defining at least one raised portion relatively raised from the etched area, and selectively forming a circuit pattern on the base film, where the circuit pattern may partly run over the raised portion. In the circuit film, the raised portion and the overlying circuit pattern may constitute film bumps.

In a method of fabricating the circuit film, a laser may partially etch the base film. The laser may remove the base film to a specific depth, for example, a specific depth per one shot of the laser. An example laser may be an eximer laser having energy of about 1000 mJ/cm2 and frequency of about 300 Hz. Selectively forming the circuit pattern may include forming a metal coating layer on the circuit pattern. Electroplating may be used to form the circuit pattern. Electroless plating may used to form the metal coating layer.

According to an embodiment, a film package may comprise a circuit film, an integrated circuit (IC) chip, and a sealing resin. The circuit film may have at least one raised portion formed in a base film, and may have a circuit pattern formed on the base film and partly running over the raised portion. The raised portion and the overlying circuit pattern may constitute film bumps. The IC chip may have input/output (I/O) pads mechanically joined and electrically coupled to the film bumps. The sealing resin may fill a space between the circuit film and the IC chip and surround the film bumps and the I/O pads.

In the film package, the base film may have an etched area defining the raised portion. The base film at the raised portion may have a first thickness substantially equal to a second thickness of the base film outside the etched area. The circuit pattern may have a metal coating layer formed thereon. Each I/O pad may have a metal coating layer or a bump formed thereon. The sealing resin may be a non-conductive resin or an anisotropic conductive resin in which a non-conductive resin contains a number of conductive particles.

According to an embodiment, a method of fabricating a film package may comprise fabricating a circuit film having film bumps, forming a sealing resin on the circuit film, and attaching an integrated circuit (IC) chip to the circuit film. Fabricating the circuit film may include partially etching a base film to create an etched area defining at least one raised portion relatively raised from the etched area, and selectively forming a circuit pattern on the base film, the circuit pattern partly running over the raised portion, the raised portion and the overlying circuit pattern constituting the film bumps. By attaching the IC chip to the circuit film, input/output (I/O) pads of the IC chip may be mechanically joined and electrically coupled to the film bumps, and the sealing resin can surround the film bumps and the I/O pads.

In the method of fabricating the film package, a laser may partially etch the base film. Selectively forming the circuit pattern may include forming a metal coating layer on the circuit pattern. The attaching the IC chip to the circuit film may include placing the I/O pads on the film bumps, and curing the sealing resin to support the I/O pads and the film bumps. Alternatively, attaching the IC chip to the circuit film may be performed by a number of conductive particles contained in the sealing resin.

BRIEF DESCRIPTION OF THE DRAWINGS

FIGS. 5A to 8B are views showing a method of fabricating a circuit film in accordance with another embodiment of the present invention, wherein:

FIGS. 9A to 10B are views showing a method of fabricating a film package in accordance with yet another embodiment of the present invention, wherein:

DETAILED DESCRIPTION OF EMBODIMENTS OF THE PREFERRED EMBODIMENTS

Embodiments of the present invention will now be described more fully with reference to the accompanying drawings. This invention may, however, be embodied in many different forms and should not be construed as limited to the embodiments herein. Rather, the disclosed embodiments are provided so that this disclosure will be thorough and complete. The principles and feature of this invention may be employed in varied and numerous embodiments without departing from the scope of the invention.

In this disclosure, well-known structures and processes are not described or illustrated in detail to avoid obscuring the present invention. Furthermore, the figures are not drawn to scale; rather, for simplicity and clarity of illustration, the dimensions of some of the elements are exaggerated relative to other elements. Like reference numerals are used for like parts of the various drawings.

Figure 4:
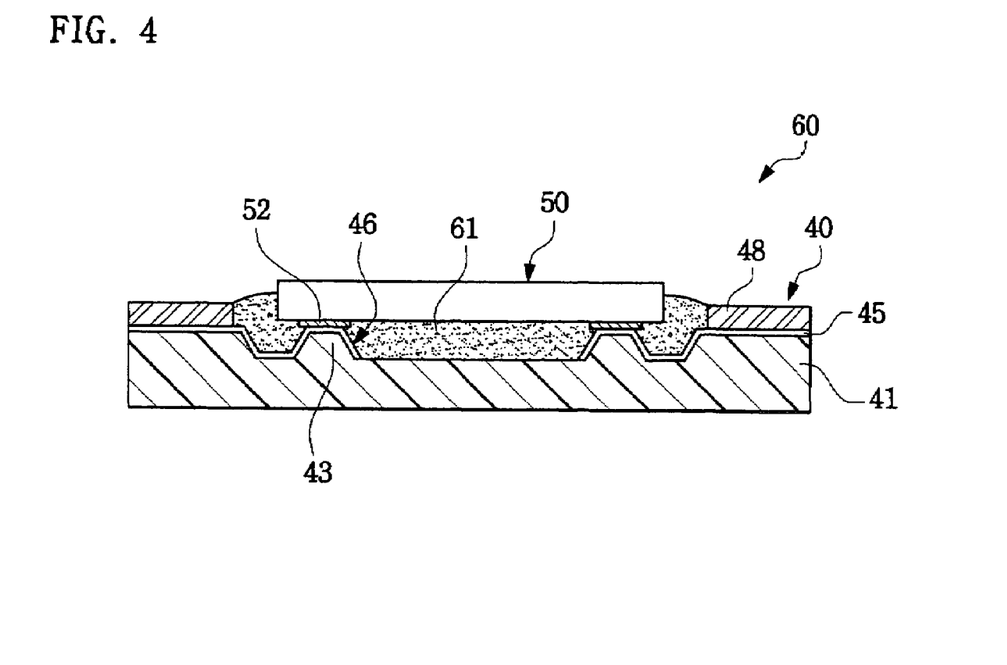
FIG. 4 is a cross-sectional view showing a circuit film and a film package in accordance with an embodiment of the present invention.

FIG. 4 shows, in a cross-sectional view, a circuit film 40 and a film package 60 in accordance with an embodiment of the present invention.

Referring to FIG. 4, the circuit film 40 and an IC chip 50 having a plurality of I/O pads 52 are mechanically joined and electrically coupled to each other by means of film bumps 46 provided in the circuit film 40. The film bumps 46 may have raised portions 43 and a circuit pattern 45. The raised portions 43 may be partly formed in a base film 41 of the circuit film 40, and the circuit pattern 45 may run over the raised portions 43. Additionally, a sealing resin 61 may be formed between the circuit film 40 and the IC chip 50 to protect and support the connection between the circuit film 40 and the IC chip 50. A protective layer 48 may also be formed on the base film 41. Since the circuit pattern 45 is typically formed on the circuit film 40, the circuit film 40 only needs the raised portions 43 to have the film bumps 46. In other words, the film bumps 46 can be easily added during the fabrication of the circuit film 40. Therefore, the entire process of fabricating the film package 60 is simplified and cost-effective.

Figure 5A:
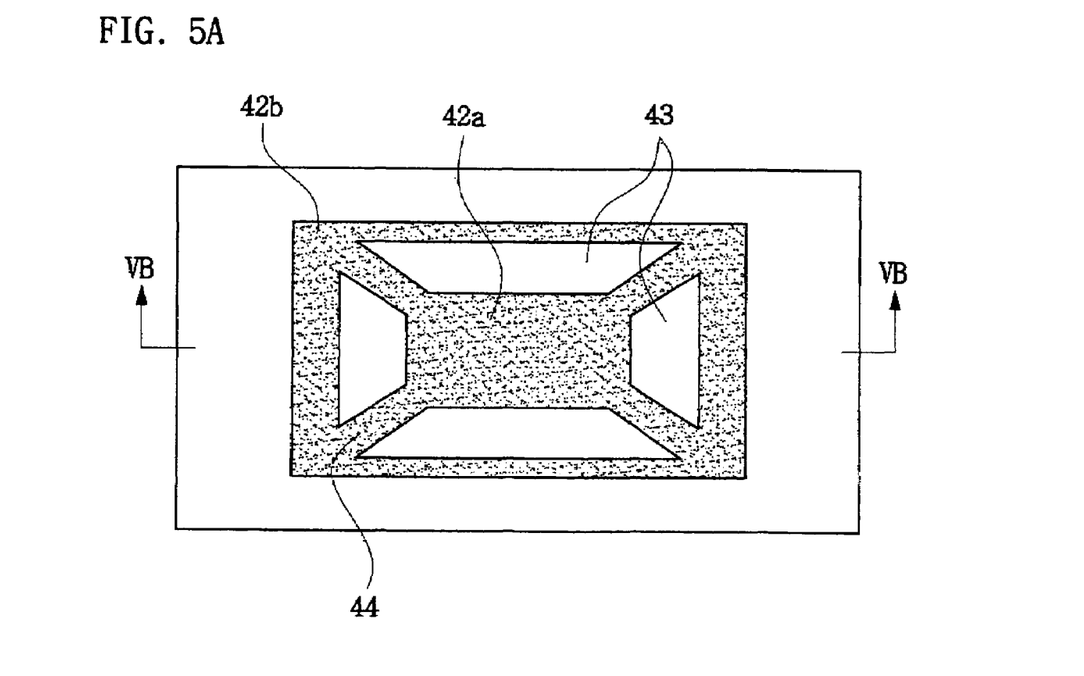
FIGS. 5A and 5B are a plan view and a cross-sectional view, respectively, showing a partial etching of a base film to form raised portions for film bumps.
Figure 5B:
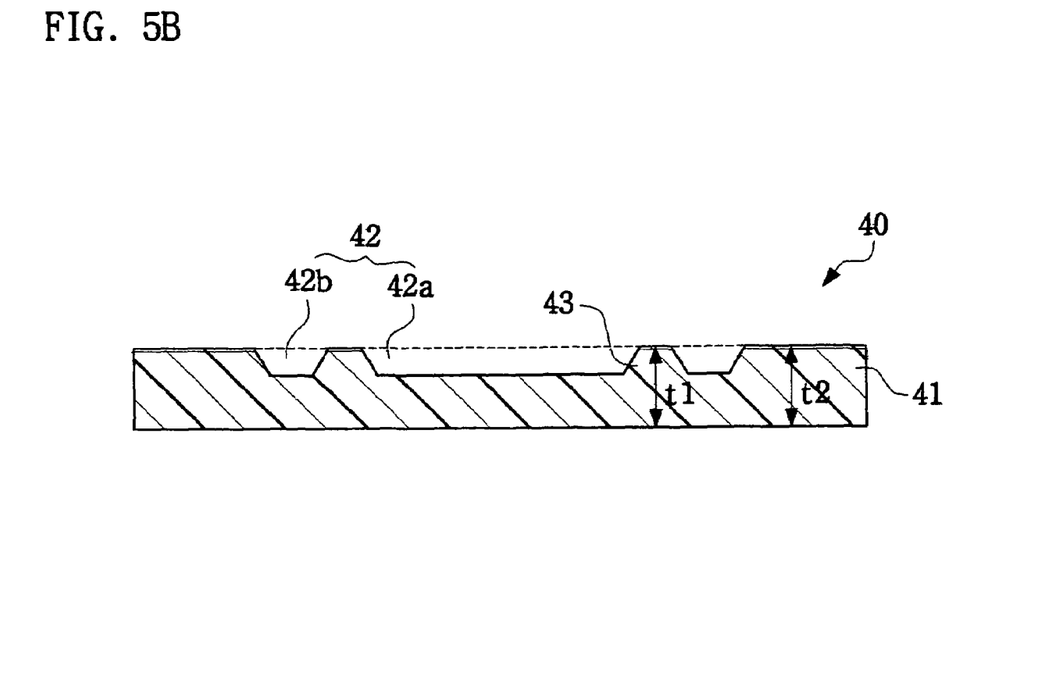

FIGS. 5A to 5B show a method of fabricating the circuit film 40. The structure of the circuit film 40 is clarified in the following description.

FIG. 5A is a plan view showing partial etching of the base film 41 to form the raised portions 43 for the film bumps 46. FIG. 5B is a cross-sectional view taken along line VB—VB of FIG. 5A.

Referring to FIGS. 5A and 5B, the base film 41 may be partially etched such that an etched area 42 is created in one surface of the base film 41 to define specific non-etched portions. For example, by depressed engraving the base film 41, the non-etched, relatively raised portions 43 are formed within the etched area 42. A first thickness (t1) of the base film 41 at the raised portions 43 may be substantially equal to a second thickness (t2) of the base film 41 outside the etched area 42. This allows formation of the film bumps (46 in FIG. 4) to not increase a height of the circuit film 40. The base film 41 may be a flexible, electrically insulating, optionally transparent, film such as a polyimide film. An example base film 41 may have a thickness of about 35 μm to about 40 μm, preferably, about 38 μm.

A laser may perform the partial etching of the base film 41. The laser may generate a focused output beam and irradiate the output beam to a target area of the base film 41. The target area exposed to the laser beam may therefore be removed to a specific depth, creating the etched area 42 and thereby defining the raised portions 43. The laser used for the partial etching may be an eximer laser, for example, having energy of about 1000 mJ/cm2 and frequency of about 300 Hz. This example eximer laser may remove the base film 41 to about 0.45 μm per one shot. It will be appreciated that the disclosed laser is exemplary only, and other suitable lasers may alternatively be used.

The etched depth of the base film 41 determines the relative height of the raised portions 43, i.e., the film bump 46. Example etched depths of the base film 41 may range from about 3 μm to about 20 μm, and therefore the height of the raised portions 43 may be substantially the same. Since the film bump 46 will meet the I/O pads 52 as shown in FIG. 4, the position of the raised portions 43 depends on that of the I/O pads 52. In addition, the raised portions 43 may be formed in a continuous fashion, as shown in FIG. 5A, corresponding to a row of the I/O pads, or alternatively may be formed in a discontinuous fashion, as shown in FIG. 6, corresponding to each I/O pad.

Figure 6:
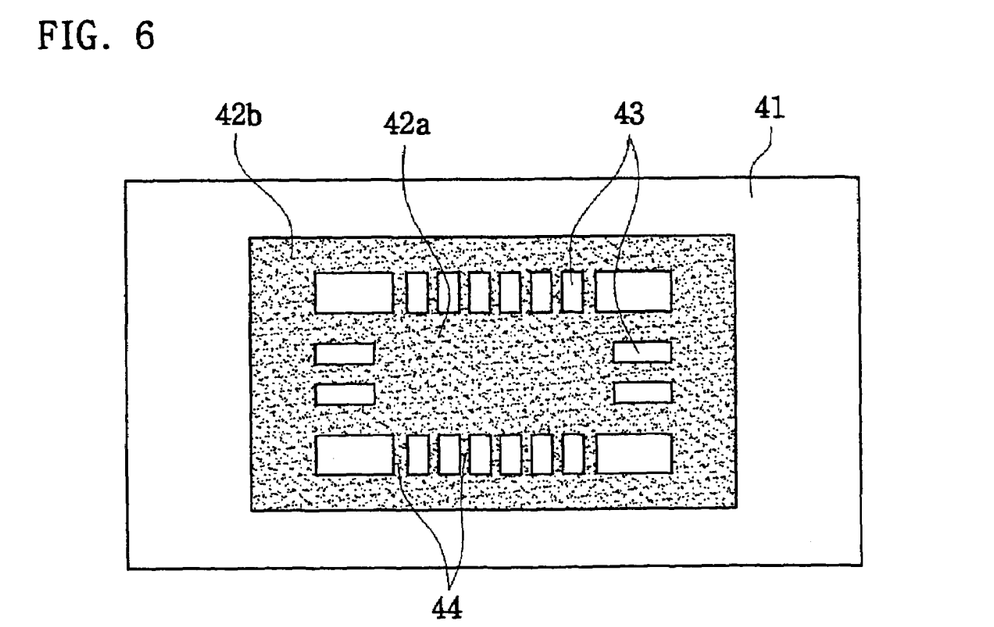
FIG. 6 is a plan view showing another example of the raised portions.

The raised portions 43 may have at least one resin outlet 44, as shown in FIGS. 5A and 6. By the resin outlet 44, an inner etched area 42a surrounded with the raised portions 43 communicates with an outer etched area 42b. The resin outlet 44 may be used as a path permitting an inflow of a sealing resin (61 in FIG. 4) when the IC chip is subsequently attached to the circuit film 40.

Figure 7A:
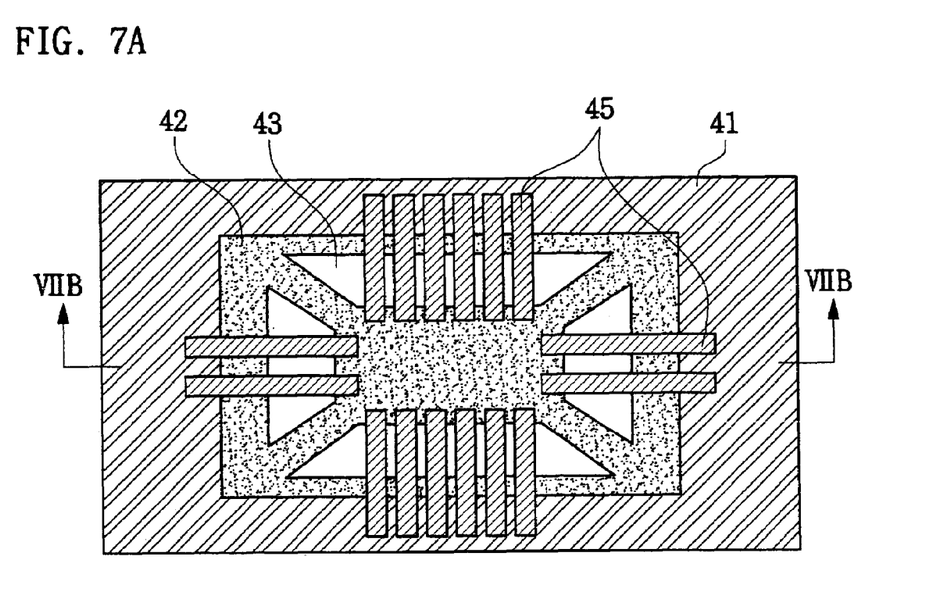
FIGS. 7A and 7B are a plan view and a cross-sectional view, respectively, showing forming a circuit pattern on the circuit film.
Figure 7B:
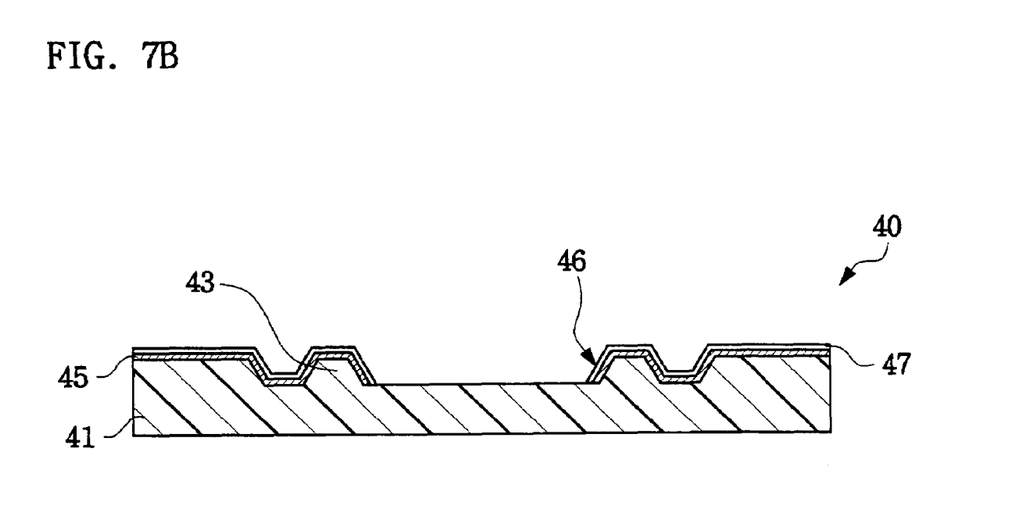

After the raised portions 43 are formed, a suitable circuit pattern may be formed. FIG. 7A is a plan view showing formation of the circuit pattern 45 on the circuit film 40. FIG. 7B is a cross-sectional view taken along line VIIB—VIIB of FIG. 7A.

Referring to the examples in FIGS. 7A and 7B, a circuit pattern 45 may be formed on the surface, and raised portions 43 are formed within the base film 41. The circuit pattern 45 may be made of electrically conductive material such as copper. For example, a copper layer may be plated on the base film 41, for example by electroplating, and then may be patterned by photolithography. Additionally, a relatively thin seed layer (not shown) may be deposited on the base film 41 before the copper layer is plated. The circuit pattern 45 may have a thickness of about 5 μm to about 15 μm, preferably, between 8 μm and 12 μm. The seed layer may be formed of metal such as chromium and nickel, and may have a thickness of about 1 μm or even less.

A part of the circuit pattern 45 may run over the raised portions 43. The raised portions 43 and the overlying circuit pattern 45 constitute the film bumps 46. Therefore, the film bumps 46 can be easily formed during the fabrication of the circuit film 40. Such process of forming the film bumps 46 is simpler and more cost-effective than the conventional method of forming the chip bumps.

The circuit pattern 45 may be coated with a metal coating layer 47. The metal coating layer 47 may enhance a stable joint between the film bumps 46 and the I/O pads (52 in FIG. 4). Example metal coating layers 47 may be formed of tin (Sn) or nickel/gold (Ni/Au), which may be plated with a thickness of several microns and then patterned. Electroless plating may be used for plating the metal coating layer 47.

Figure 8A:
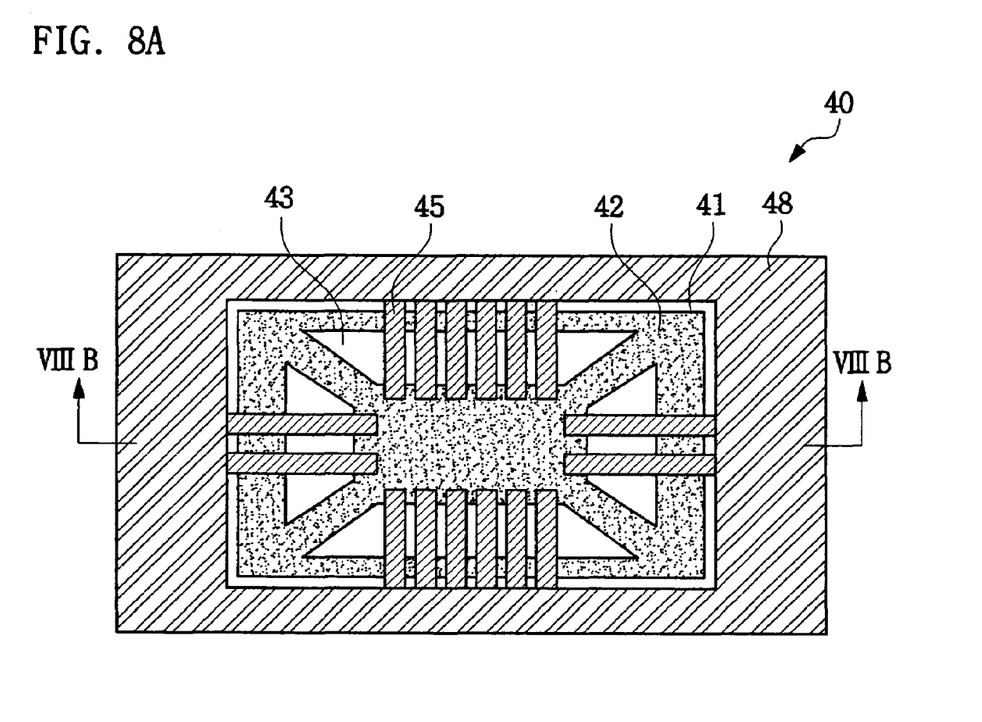
FIGS. 8A and 8B are a plan view and a cross-sectional view, respectively, showing forming a protective layer on the circuit film.
Figure 8B:
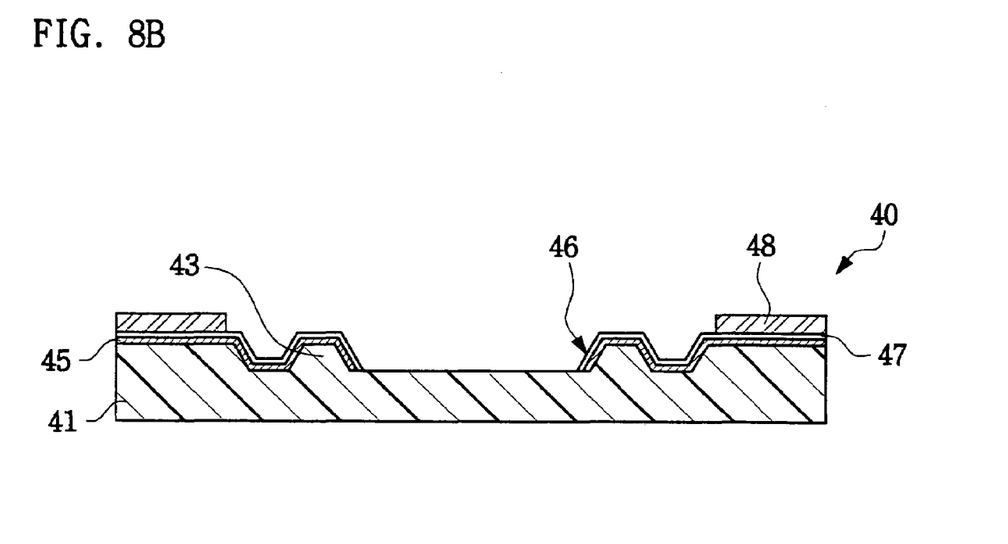

After the circuit pattern 45 is formed, a protective layer may be formed. FIG. 8A is a plan view showing formation of the protective layer 48 on the circuit film 40. FIG. 8B is a cross-sectional view taken along line VIIIB—VIIIB of FIG. 8A.

Referring to FIGS. 8A and 8B, the protective layer 48 may be formed on the surface of the base film 41, where the circuit pattern 45 is formed, except a region for receiving an IC chip. The protective layer 48 may be formed of solder resist material.

The circuit film 40, fabricated by the above-discussed method, may be used for the film package. FIGS. 9A to 10B are views showing a method of fabricating the film package 60 in accordance with yet another embodiment of the present invention. The structure of the film package 60 is clarified in the following description.

Figure 9A:
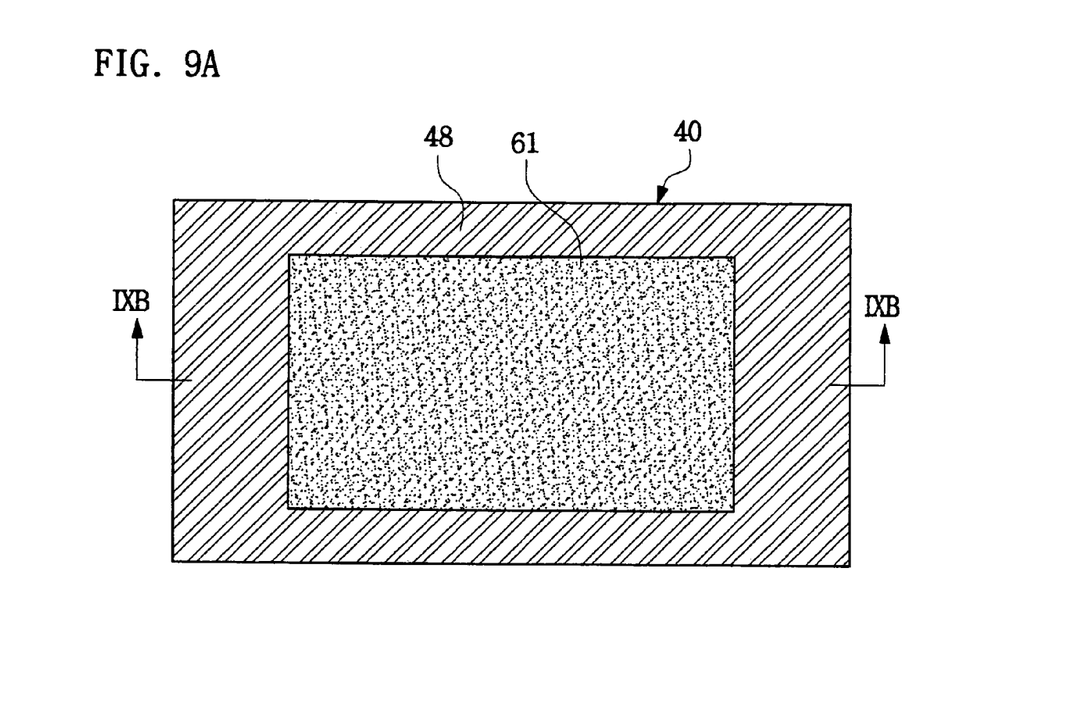
FIGS. 9A and 9B are a plan view and a cross-sectional view, respectively, showing applying a sealing resin to the circuit film.
Figure 9B:
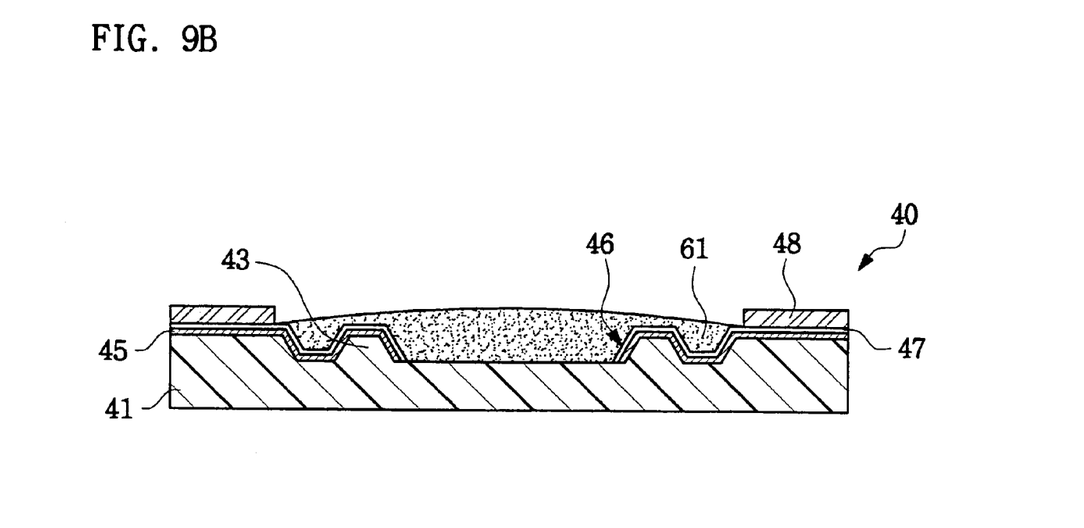

FIG. 9A is a plan view showing application of the sealing resin 61 to the circuit film 40. FIG. 9B is a cross-sectional view taken along line IXB—IXB of FIG. 9A.

Referring to FIGS. 9A and 9B, the sealing resin 61 may be applied to the chip-receiving region and surrounded with the protective layer 48 of the circuit film 40. The sealing resin 61 may be a non-conductive resin such as epoxy resin and acrylate resin. The sealing resin 61 may be paste or film. While the paste resin may be formed by dispensing, the film resin may be formed by attaching. The sealing resin 61 protects and supports connections between the circuit film 40 and the IC chip 50.

Figure 10A:
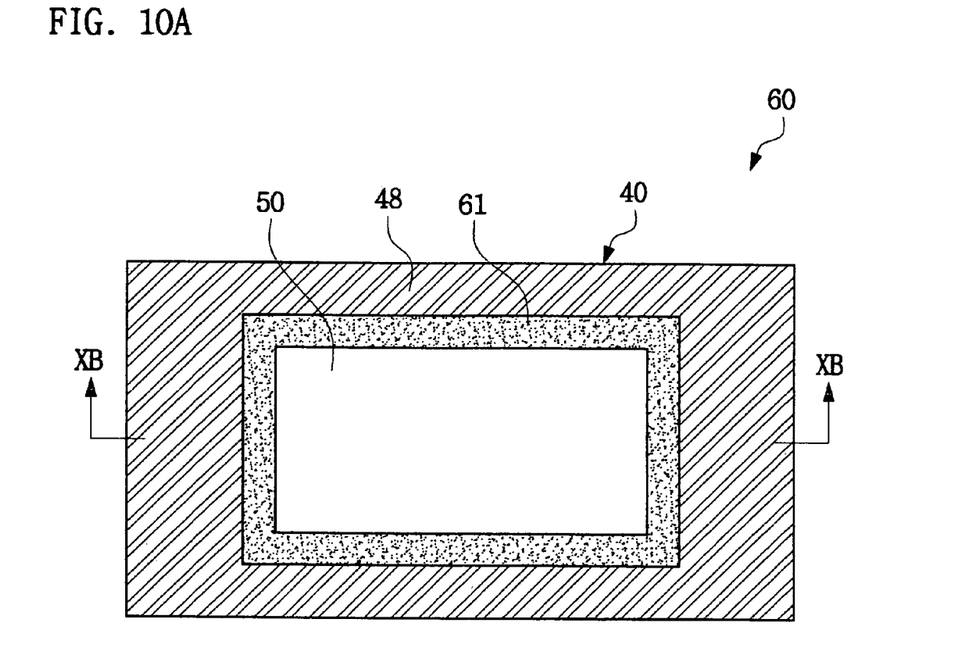
FIGS. 10A and 10B are a plan view and a cross-sectional view, respectively, showing attaching an IC chip to the circuit film.
Figure 10B:
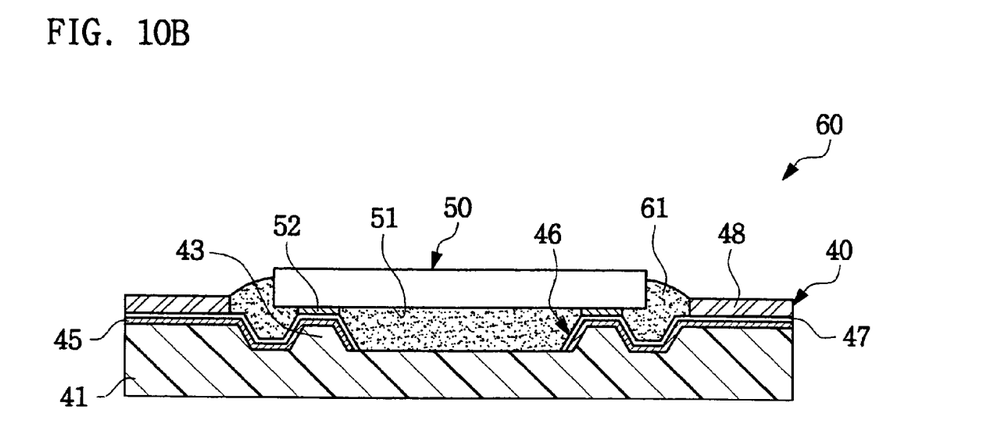

After the sealing resin 61 is formed, the IC chip 50 may be attached to the circuit film 40. FIG. 10A is a plan view showing attachment of the IC chip 50 to the circuit film 40. FIG. 10B is a cross-sectional view taken along line XB—XB of FIG. 10A.

Referring to FIGS. 10A and 10B, the circuit film 40 and the IC chip 50 are connected to each other through the film bumps 46 and the I/O pads 52. An example IC chip 50 may be a driver device for driving a liquid crystal display (LCD) panel, but is not so limited. The IC chip 50 has a number of I/O pads 52 arranged on an active surface. Example I/O pads 52 may be formed of aluminum (Al) or copper (Cu).

In a process of attaching an IC chip 50, the active surface of the IC chip 50 may face the circuit film 40. Then the IC chip 50 may be aligned with the circuit film 40 such that the I/O pads 52 coincide with the film bumps 46. Next, the I/O pads 52 may be placed on and joined to the film bumps 46 with suitable heat and pressure, and further, the sealing resin 61 may surround the I/O pads 52 and the film bumps 46, filling a space between the IC chip 50 and the circuit film 40. The sealing resin 61 may then be cured, so the I/O pad 52 and the film bumps 46 are fixedly supported by the sealing resin 61 and electrically coupled to each other.

Figure 11:
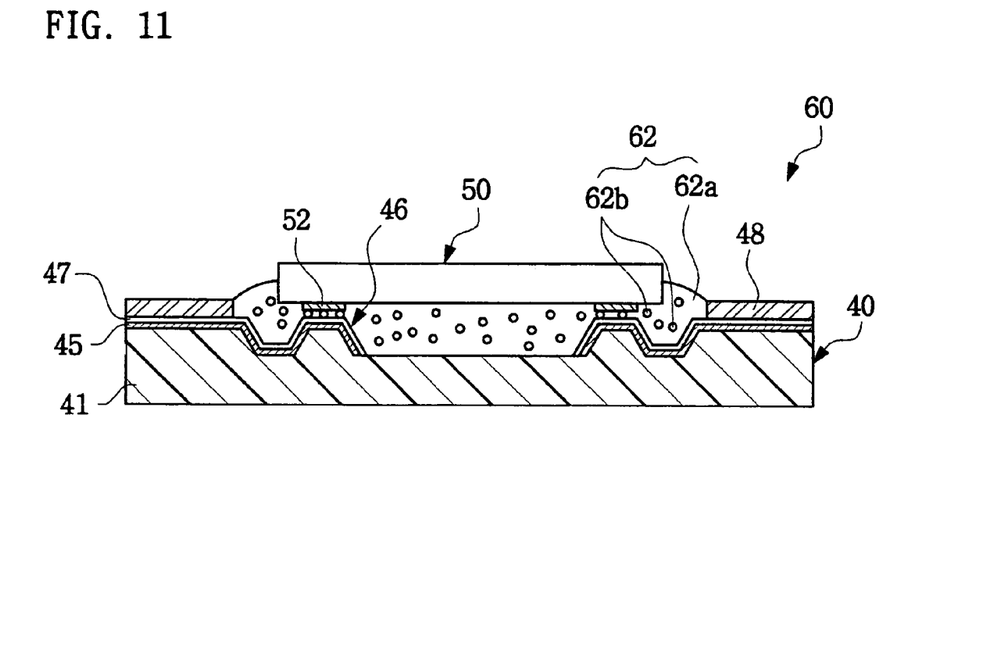
FIG. 11 is a cross-sectional view of a film package in accordance with still another embodiment of the present invention.

In an embodiment, another type of sealing resin may be favorably used for attaching the IC chip 50 to the circuit film 40. FIG. 11 shows, in a cross-sectional view, a film package 60 using another sealing resin 62.

Referring to FIG. 11, the sealing resin 62 of this embodiment may be an anisotropic conductive resin in which a non-conductive resin 62a contains a number of conductive particles 62b. When the IC chip 50 is attached to the circuit film 40, the conductive particles 62b may be interposed between the I/O pads 52 and the film bumps 46, thereby providing electrical paths. This type sealing resin 62 may also be provided as a paste or film.

In another embodiment, the metal coating layer 47 on the circuit pattern 45 may be formed also on the I/O pads 52. In addition, if necessary, the I/O pads 52 may further have gold or solder bumps formed thereon. Such bumps may have a height of about 5 μm and less.

Figure 12:
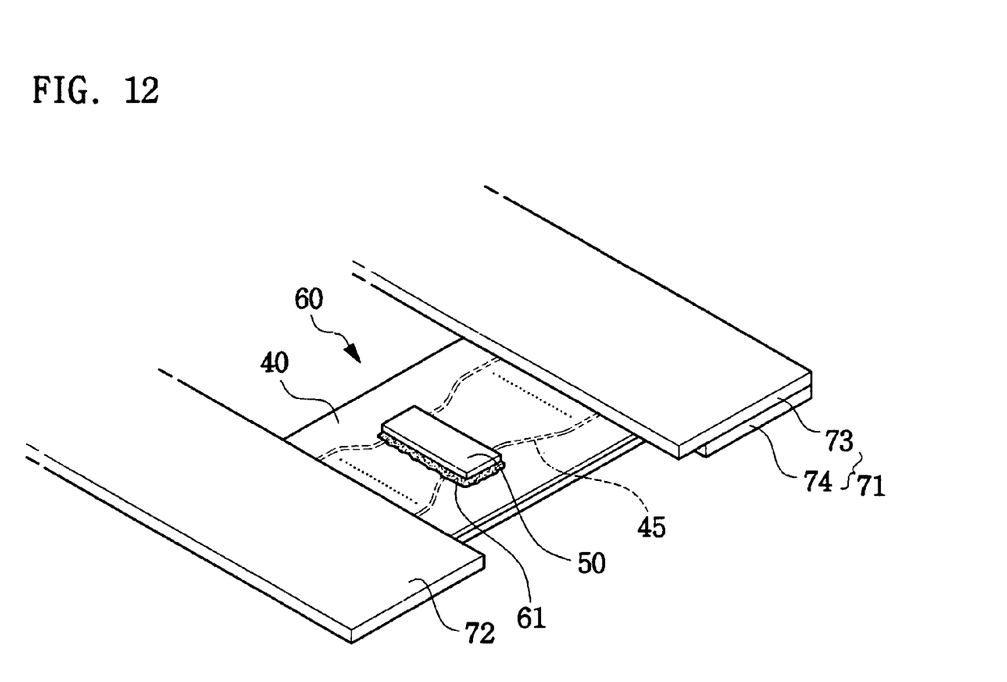
FIG. 12 is a perspective view showing a mounting structure of the film package in accordance with an embodiment of the present invention.

An example film package 60 fabricated by the above-discussed method may be mounted on an LCD module. FIG. 12 shows, in a perspective view, a mounting structure of the film package 60. It will be appreciated, however, this structure shown in FIG. 12 is exemplary and not a limitation of other embodiments of the invention. Since the LCD module has been well known in the art and is not necessary to understand the invention, a detailed illustration and description of the LCD module is omitted.

Referring to FIG. 12, a film package 60 may be mounted on both an LCD panel 71 and a printed circuit board (PCB) 72. The LCD panel 71 may be composed of two boards, e.g., a thin film transistor (TFT) board 73 and a color filter board 74. The circuit pattern 45 of the circuit film 40 acts as terminals of the package 60, and may be electrically coupled to the TFT board 73 and the PCB 72. Specifically, output terminals of the circuit pattern 45 are coupled to input pads of the TFT board 73, and input terminals of the circuit pattern 45 are coupled to output pads of the PCB 72.

While this invention has been particularly shown and described with reference to exemplary embodiments, it will be understood that various changes in form and details may be made without departing from the spirit and scope of the invention as defined by the appended claims.

What is claimed is:

1. A circuit film comprising:
    a base film having a top surface and including an etched region etched below the top surface of the base film to define at least one raised portion of the base film and including a non-etched peripheral portion of the base film, the etched region comprising
    an inner portion at least partially surrounded by the raised portion of the base film,
    an outer portion surrounding the raised portion of the base film and the inner portion of the etched region, the outer portion encompassed by the peripheral portion of the base film, and
    at least one etched outlet connecting the inner portion to the outer portion; and
    a circuit pattern formed on at least a portion of the base film including the raised portion, wherein the raised portion of the base film and the circuit pattern comprise at least one film bump.

2. The circuit film of claim 1, wherein a first thickness of the base film at the raised portion is substantially equal to a second thickness of the peripheral portion of the base film.

3. The circuit film of claim 2, wherein the first and second thickness of the base film is about 35 μm to about 40 μm, and a relative height of the raised portion from the etched area is about 3 μm to about 20 μm.

4. The circuit film of claim 1, wherein the circuit pattern has a metal coating layer formed thereon.

5. The circuit film of claim 1, wherein the circuit pattern comprises copper.

6. The circuit film of claim 4, wherein the metal coating layer comprises at least one of tin and nickel/gold.

7. A film package comprising:
    a circuit film including a base film having an etched region to define at least one raised portion of the base film and a circuit pattern formed on at least a portion of the base film including the raised portion, wherein the etched region comprises an inner portion at least partially surrounded by the raised portion, an outer portion, and at least one etched outlet connecting the inner portion to the outer portion, and wherein the raised portion of the base film and the circuit pattern comprise at least one film bump;
    an integrated circuit (IC) chip having input/output (I/O) pads mechanically joined and electrically coupled to the film bumps; and
    a sealing resin between the circuit film and the IC chip, wherein the sealing resin is formed in the inner portion of the etched region, the etched outlet of the etched region, and at least a portion of the outer portion of the etched region.

8. The film package of claim 7, wherein a first thickness of the base film at the raised portion is substantially equal to a second thickness of the base film outside the etched area.

9. The film package of claim 7, wherein the circuit pattern has a metal coating layer formed thereon.

10. The film package of claim 7, wherein each I/O pad has a metal coating layer.

11. The film package of claim 7, wherein each I/O pad has a bump.

12. The film package of claim 7, wherein the sealing resin is a non-conductive resin.

13. The film package of claim 7, wherein the sealing resin is an anisotropic conductive resin.

14. The film package of claim 13, wherein the anisotropic conductive resin is a non-conductive resin that contains conductive particles.

* * * * *

UNITED STATES PATENT AND TRADEMARK OFFICE
CERTIFICATE OF CORRECTION

| | | |
|---|---|---|
| PATENT NO. | : 7,190,073 B2 | |
| APPLICATION NO. | : 11/158164 | |
| DATED | : March 13, 2007 | |
| INVENTOR(S) | : Yong-Hwan Kwon et al. | |

It is certified that error appears in the above-identified patent and that said Letters Patent is hereby corrected as shown below:

On the Title Page Item (56)
Foreign Patent Documents, the "2003-00333706" should read
-- 2003-0033706 --;
Column 4, line 41, the word "5B" should read -- 8B --.

Signed and Sealed this

Twelfth Day of August, 2008

JON W. DUDAS
*Director of the United States Patent and Trademark Office*